US009734945B2

(12) United States Patent
Robertson et al.

(10) Patent No.: US 9,734,945 B2
(45) **Date of Patent: *Aug. 15, 2017**

(54) MAGNETIC SHIELD

(71) Applicant: PowerbyProxi Limited, Freemans Bay, Auckland (NZ)

(72) Inventors: Daniel Robertson, Auckland (NZ); Kunal Bhargava, Auckland (NZ); Fady Mishriki, Auckland (NZ); Saining Sunny Ren, Auckland (NZ)

(73) Assignee: PowerbyProxi Limited, Freemans Bay, Auckland (NZ)

( * ) Notice: Subject to any disclaimer, the term of this patent is extended or adjusted under 35 U.S.C. 154(b) by 0 days.

This patent is subject to a terminal disclaimer.

(21) Appl. No.: 15/175,459

(22) Filed: Jun. 7, 2016

(65) Prior Publication Data

US 2016/0293327 A1 Oct. 6, 2016

Related U.S. Application Data

(63) Continuation of application No. 13/816,223, filed as application No. PCT/NZ2011/000131 on Jul. 14, 2011, now Pat. No. 9,386,731.

(30) Foreign Application Priority Data

Aug. 10, 2010 (NZ) ........................................ 587296

(51) Int. Cl.
*H01F 27/00* (2006.01)
*H01F 38/14* (2006.01)
(Continued)

(52) U.S. Cl.
CPC ........... *H01F 38/14* (2013.01); *H01F 27/289* (2013.01); *H01F 27/365* (2013.01); *H05K 9/00* (2013.01);
(Continued)

(58) Field of Classification Search
CPC ........................................................ H01F 38/14
(Continued)

(56) References Cited

U.S. PATENT DOCUMENTS 1,942,575 A 1/1934 Lazarus
2,724,735 A 11/1995 Johnston
(Continued)

FOREIGN PATENT DOCUMENTS

CN 101404203 4/2009
CN 101563023 A 10/2009
(Continued)

OTHER PUBLICATIONS

International Search Report for International Application No. PCT/NZ2011/000131 mailed Nov. 9, 2011 (3 pages).
(Continued)

*Primary Examiner* — Stephen W Jackson
(74) *Attorney, Agent, or Firm* — Merchant & Gould P.C.

(57) ABSTRACT

A magnetic shield for shielding adjacent coils of an ICPT system. One or more conductors are configured to distribute induced eddy currents from the surface of the shield to below the surface and thus reduce heating due to eddy currents. The magnetic shield may be employed to transfer power over rotary couplings, such as the shaft of a wind turbine.

14 Claims, 4 Drawing Sheets

23

25

24

(51) Int. Cl.

| | |
|---|---|
| ***H05K 9/00*** | (2006.01) |
| ***H01F 27/28*** | (2006.01) |
| ***H01F 27/36*** | (2006.01) |
| *H02J 17/00* | (2006.01) |
| *H01F 27/34* | (2006.01) |

(52) U.S. Cl.
CPC ..... *H05K 9/0075* (2013.01); *H01F 2027/348* (2013.01); *H02J 17/00* (2013.01)

(58) Field of Classification Search
USPC .......................................................... 307/104
See application file for complete search history.

(56) References Cited

U.S. PATENT DOCUMENTS

| | | | | |
|---|---|---|---|---|
| 5,722,326 | A | 3/1998 | Post | |
| 6,758,146 | B2 | 7/2004 | Post | |
| 7,339,120 | B2 | 3/2008 | Notohara | |
| 8,766,487 | B2 * | 7/2014 | Dibben | H02J 5/005 307/104 |
| 8,829,732 | B2 | 9/2014 | Tengner | |
| 9,035,501 | B2 * | 5/2015 | Azancot | H01F 38/14 307/104 |
| 2005/0029919 | A1 | 2/2005 | Notohara et al. | |
| 2007/0064406 | A1 | 3/2007 | Beart | |
| 2007/0159753 | A1 | 7/2007 | Randall et al. | |
| 2008/0122570 | A1 | 5/2008 | Takaishi | |
| 2009/0021212 | A1 | 1/2009 | Hasegawa et al. | |

FOREIGN PATENT DOCUMENTS

| | | | |
|---|---|---|---|
| CN | 101572421 | A | 11/2009 |
| EP | 1928003 | A2 | 6/2008 |
| JP | 03-248599 | | 11/1991 |
| JP | 10-183815 | | 7/1998 |
| JP | 10-270160 | | 10/1998 |
| JP | 11-040973 | | 2/1999 |
| JP | 2002170725 | | 6/2002 |
| JP | 2002170725 | A | 6/2002 |
| JP | 2004-037008 | | 2/2004 |
| JP | 2004-342339 | | 12/2004 |
| JP | 2009-172072 | | 8/2009 |
| NZ | 555128 | | 1/2010 |

OTHER PUBLICATIONS

Chinese Office Action for CN Application No. 201180039399.9 mailed Jul. 3, 2015 (9 pages).

2nd Chinese Office Action for corresponding CN Application No. 201180039399.9 mailed Mar. 9, 2016 (4 pages).

3rd Chinese Office Action for corresponding CN Application No. 201180039399.9 mailed Dec. 7, 2016 (12 pages), partial translation attached.

Extended European Search Report for EP Application No. 11816672.7 mailed Sep. 22, 2016 (8 pages).

Chinese Office Action for CN Application No. 201180039399.9 dated May 11, 2017 (10 pages), English translation included.

* cited by examiner

MAGNETIC SHIELD

This application is a Continuation of U.S. application Ser. No. 13/816,223, filed on 22 May 2013, which is a National Stage Application of PCT/NZ2011/000131, filed on 14 Jul. 2011, which claims benefit of Ser. No. 587296, filed on 10 Aug. 2010 in New Zealand and which application(s) are incorporated herein by reference. To the extent appropriate, a claim of priority is made to each of the above disclosed applications.

FIELD OF THE INVENTION

This invention relates to a magnetic shield. More particularly but not exclusively the invention relates to a magnetic shield for shielding transmitting and receiving coil pairs of an inductively coupled power transfer (ICPT) system. It also relates to shields for shielding metallic objects in close proximity.

BACKGROUND OF THE INVENTION

In ICPT systems it is sometimes necessary to have transmitting and receiving coils in close proximity to other transmitting and receiving coils, to electrically conductive surfaces, or to sensitive electronics. For example, in the multiple power and data transmission channels commonly employed in wind turbines. It is desirable for each channel to be isolated from the adjacent channel. Conventionally this may be achieved using a conductive plate between channels. It may also be desirable to provide shielding to avoid losses due to surrounding metallic elements.

Time-varying magnetic fields generate eddy currents in conductive materials that act to cancel the applied magnetic fields. The result is that magnetic fields are repelled from the surface of the conductor. Within this document, this effect is referred to as "magnetic shielding" or simply "shielding".

Solid conductive plates provide good shielding but suffer from overheating for two reasons:

Firstly and most importantly, though a conductive plate shield may be physically thick, at ICPT frequencies, only the surface of the conductive plate will conduct current, due to the skin effect. This means that the effective resistance of the conductive sheet is much higher than would be measured at DC, so the resistive losses in the shield can be high.

Secondly, the regions of the solid conductive plate where the incident magnetic field is strongest will have higher losses than other areas with weaker incident magnetic fields. This is because the eddy currents are higher in the regions with high incident magnetic field.

Existing shields suffer from limited flexibility in that their degree of screening cannot be easily tailored to a specific requirement. Other things being equal, better screening corresponds to higher losses and vice versa, therefore it would be useful to have a method whereby the screening effect could be reduced or increased to the required level (and no further) such that losses are minimized while still achieving the desired level of screening.

It would be desirable to provide a magnetic shield that provides effective and flexible shielding whilst avoiding the heating problems of the prior art or to at least provide the public with a useful choice.

EXEMPLARY EMBODIMENTS

According to one exemplary embodiment there is provided an ICPT system including a transmitting coil and a receiving coil wherein at least one coil is at least partly shielded by a magnetic shield formed of one or more conductors wherein the shield has a surface which in use is exposed to an incident magnetic field wherein the one or more conductors undulate towards and away from the surface so as to distribute currents induced in portions of the one or more conductors at the surface of the shield to portions of the one or more conductors away from the surface of the shield.

Preferably the one or more conductors undulate from a depth within about one skin depth from the surface to greater than one skin depth below the surface. The one or more conductors are preferably elongate conductors arranged to distribute the eddy currents along a path length that is long with respect to the size of the shield.

The one or more conductors preferably have an average thickness of about 1 to 3 skin depths in a plane transverse to the surface cross section. The one or more conductors are preferably formed of Litz wire.

The conductors may be arranged in a generally circular or spiral path and the shield may be in the form of a disc, semicircle, curved sheet or other form. Shapes which minimize the amount of the conductive element which is not exposed to the time varying magnetic field will have the strongest shielding effect, other things being equal. The conductors may be capacitively or inductively loaded.

In one embodiment, the at least one coil of the ICPT system may be at least partly shielded from its surrounds. In a further embodiment, the at least one coil may be at least partly shielded from surrounding metallic elements. In a yet further embodiment, the at least one coil may be at least partly shielded from an adjacent coil.

The ICPT system may be particularly suited for use in a wind turbine.

By creating a shield from low resistance wire, such as Litz wire, the effective resistance of the shield may fall by a factor of 10 or more as compared with a sheet metal shield, with losses falling in proportion.

BRIEF DESCRIPTION OF THE DRAWINGS

The accompanying drawings which are incorporated in and constitute part of the specification, illustrate embodiments of the invention and, together with the general description of the invention given above, and the detailed description of embodiments given below, serve to explain the principles of the invention.

DETAILED DESCRIPTION OF EMBODIMENTS OF THE INVENTION

Figure 1:
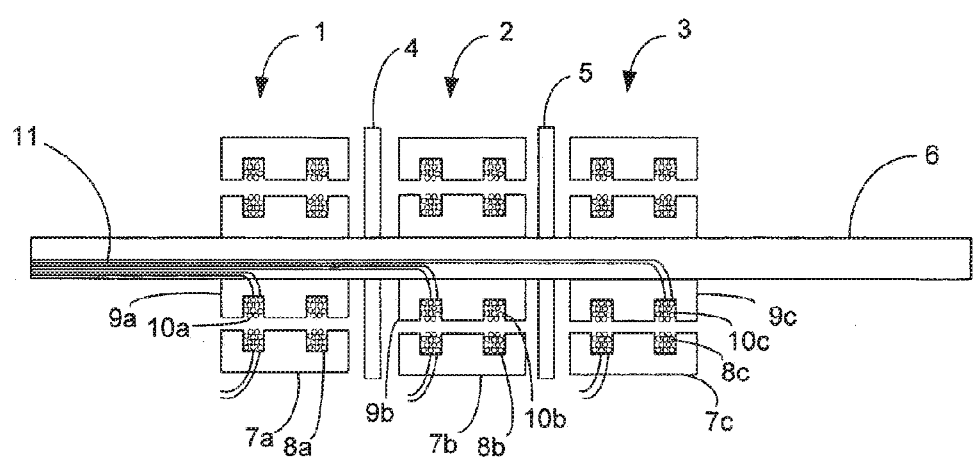
FIG. 1 shows an ICPT system mounted on the shaft of a wind turbine.

Referring to FIG. 1 a plurality of transmitting and receiving coil pairs 1 to 3 of an ICPT system mounted to a shaft 6 of a wind turbine. In such applications it is desirable to have multiple channels for load carrying and redundancy and to separate power and data channels. Power supplied to coils 8*a* to 8*c* modulated at about 100 kHz may be extracted by coils 10*a* to 10*c* and supplied to the nacelle of the turbine via lines 11 to drive pitch control mechanisms etc. Data may also be bi-directionally transferred over such links.

Receiving coils 10*a* to 10*c* are mounted within annular E cores 9*a* to 9*c* mounted to shaft 6 and are rotatable with respect to stationary transmitting coils 8*a* to 8*c* and annular E cores 7*a* to 7*c*. When the transmitting coils 8*a* to 8*c* are excited modulating magnetic fields are generated which are substantially coupled to respective receiving coils 10*a* to 10*c* by cores 7*a* to 7*c* and 9*a* to 9*c*. However, the magnetic coupling is not perfect and magnetic fields generated by adjacent coil pairs may cause interference.

Figure 2:
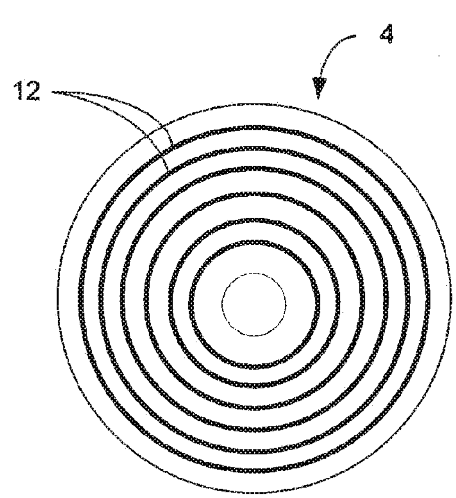
FIG. 2 shows a magnetic shield according to one embodiment.
Figure 3:
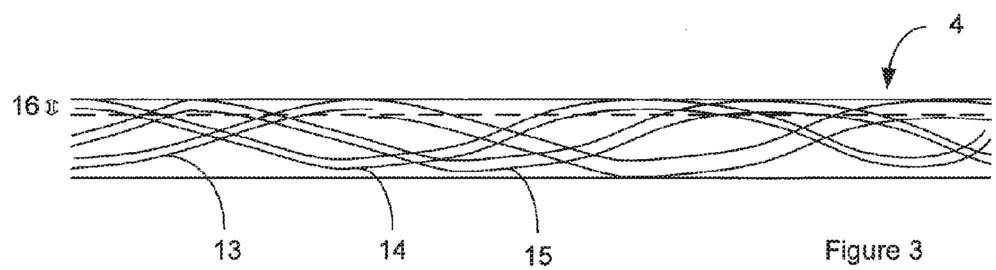
FIG. 3 shows the arrangement of conductors in the shield shown in FIG. 2.
Figure 4:
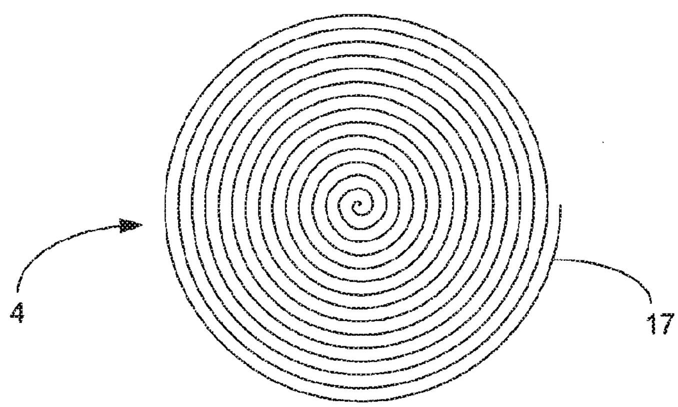
FIG. 4 shows a magnetic shield according to another embodiment.

This magnetic interference between adjacent coil pairs could be shielded using a solid metal plate. However, solid metal plates may generate substantial eddy current losses that can cause overheating and reduced efficiency beyond allowed limits for various applications. In one embodiment magnetic shields 4 and 5 may be in the form of a disc formed by one or more concentric rings of conductors 12 as shown in FIG. 2 or spiral wound conductors as shown in FIG. 4. The conductors may be Litz wire rather than a sheet of copper as in conventional shields. As shown in FIG. 3 Litz wire has an arrangement such that strands 13, 14 and 15 undulate towards and away from the surface of the shield. Due to the skin effect eddy currents are principally induced at the surface of the shield oriented towards incident magnetic fields. The skin depth 16 is indicated by the dashed line in FIG. 3.

The eddy currents induced in the strands 13, 14 and 15 at the surface are conveyed below the surface where, due to the skin effect, much lower eddy currents are induced. Litz wire is typically arranged so that each strand of wire has approximately the same exposure to an incident magnetic field at the surface of the shield. In this way the induced currents are effectively distributed throughout the shield so as to reduce the effective resistance of the shield. This significantly reduces the eddy current losses by reducing the AC resistance of the material in which the eddy currents are flowing. This is different to, say, laminations in a transformer, where the goal is to reduce the eddy currents.

The skin depth may be calculated using the equation:

$$\delta = \frac{1}{\sqrt{\pi\mu_o}}\sqrt{\frac{\rho}{\mu_r f}} \approx 503\sqrt{\frac{\rho}{\mu_r f}} \quad (9)$$

where $\delta$=the skin depth in meters $\mu_0=4\pi\times10^{-7}$ H/m $\mu_r$=the relative permeability of the medium $\rho$=the resistivity of the medium $\Omega\cdot$m (for Cu=$1.68\times10^{-8}$ $\Omega\cdot$m)

f=the frequency of the wave in Hz

If the resistivity of aluminum is taken as $2.8\times10^{-8}$ $\Omega\cdot$m and its relative permeability is 1, then the skin depth at a frequency of 50 Hz is given by $$\delta = 503\sqrt{\frac{2.82\cdot10^{-8}}{1\cdot50}} = 11.9 \text{ mm}$$

Selecting the strand radius to be about 1-3 skin depths allows the shield to be compact and efficiently employ conductive material.

Using a spiral coil as shown in FIG. 4 rather than concentric coils as shown in FIG. 2 distributes induced eddy currents about the shield so as to reduce local current density and thus reduce heating. Because resistive losses vary with the square of current, it is desirable in this case that the current density as a result of the incident time varying magnetic field be constant throughout the shield so that excessive losses are not created in certain localized regions of high magnetic field strength. Therefore the radial thickness spanned by the spiral shield coil should be wider than the localized area where the magnetic field strength is high.

Reducing the resistance of the one or more conductors in the magnetic shield reduces heating effects and increases the overall power transfer efficiency of the ICPT system. Low AC resistance materials such as Litz wire are preferred as they have lower losses and thus generate less heat. However, other arrangements of conductors allowing distribution of eddy currents below the surface may also be employed.

Figure 5:
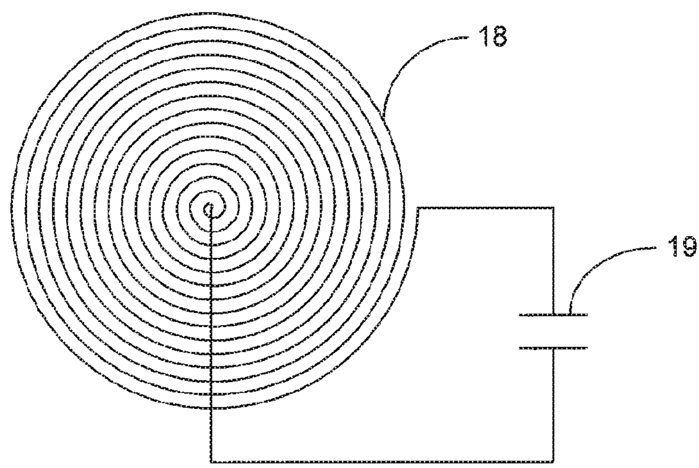
FIG. 5 shows schematically a capacitively loaded magnetic shield.

FIG. 5 shows an embodiment in which one or more spiral conductors 18 are loaded by capacitor 19. It is believed that an appropriately tuned or off-tuned capacitively loaded coil such as 18 may provide a powerful screening effect. It may be possible to tune the shield to provide optimum screening between two coils operating at different frequencies by tuning the shield to an off frequency.

Figure 6:
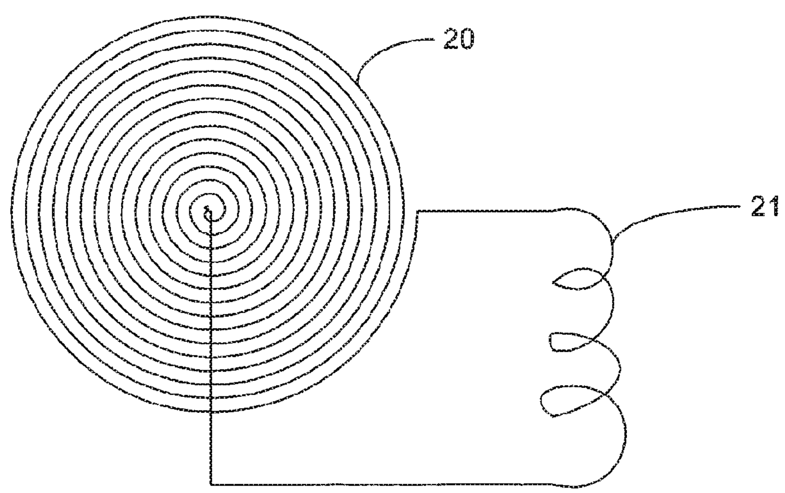
FIG. 6 shows schematically an inductively loaded magnetic shield.

FIG. 6 shows an embodiment in which one or more spiral conductors 20 are inductively loaded by inductor 21. An inductively loaded coil may reduce losses at the expense of slightly poorer screening/shielding.

Whilst the spiral arrangement will reduce the screening effectiveness with respect to a metal sheet it is a tradeoff between heat generation and screening effect for a particular application.

By using a magnetic shield made from a spiral of insulated wire as opposed to a single conductive sheet, the overall losses in the magnetic shield are reduced because the current density is more uniform across the shield. The shielding effect may be somewhat reduced, however.

Figure 7:
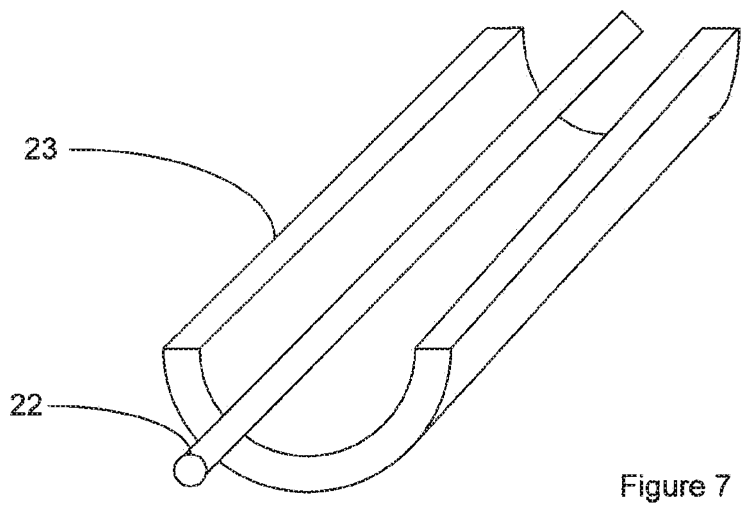
FIG. 7 shows a magnetic shield for shielding one side of a conductor.

There are a variety of shapes that a shield could take on and the selected shape will depend on the coupling arrangement and/or the shape of the field to be shielded. For example, to shield a wire 22 carrying a time varying current, a shield 23 as shown in FIG. 7 could be used. In this case shield 23 could be in the form of a mat of Litz wire. By shielding a ferrite core, this could also serve as an effective “flux conduit” to efficiently transport flux from one place to another without leakage, within a pickup or in another application.

Figure 8:
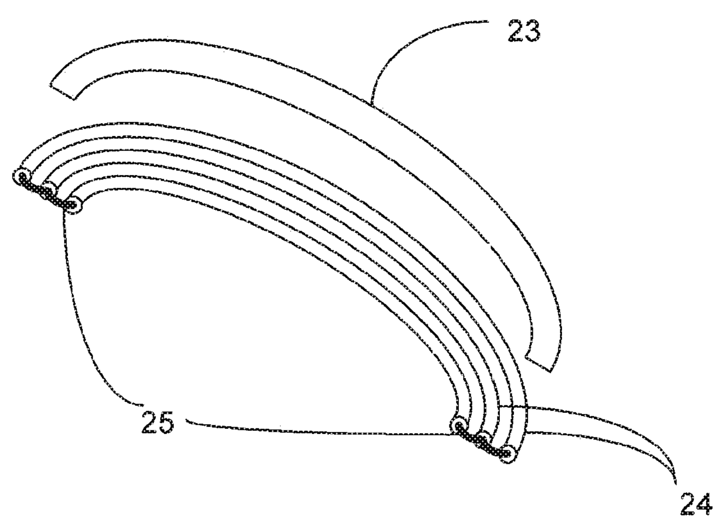
FIG. 8 shows a magnetic shield for shielding a semicircular coil.
Figure 9:
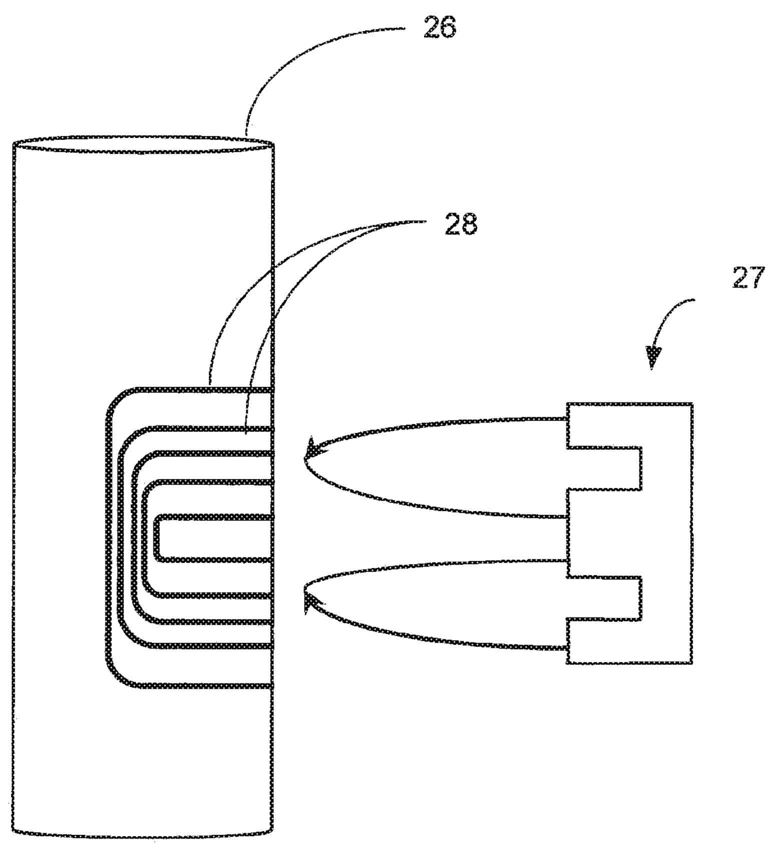
FIG. 9 shows a magnetic shield in the form of a curved sheet about a cylindrical metal shaft.

For a clamshell application (where two halves 23 of a conductive coil are joined about a shaft) a shield of the form shown in FIG. 8 may be employed. By electrically joining the tips of each shielding wire 24 with links 25, the wires with the lowest incident B field would serve as the return path. Screening effectiveness will be somewhat reduced compared to a complete circular shield but this arrangement provides effective shielding with lower loss where an end fit is not possible.

The use of Litz wire in shields and inductively and capacitvely loaded shielding coils has potential application in maglev rail transport, where the time varying magnetic field may be provided by moving permanent magnets, as per patents U.S. Pat. No. 5,722,326 and U.S. Pat. No. 6,758,146. In this case, a Litz wire coil could replace the solid copper coils shown in these patents and thereby reduce the train's power consumption.

While the present invention has been illustrated by the description of the embodiments thereof, and while the embodiments have been described in detail, it is not the intention of the Applicant to restrict or in any way limit the scope of the appended claims to such detail. Additional advantages and modifications will readily appear to those skilled in the art. Therefore, the invention in its broader aspects is not limited to the specific details, representative apparatus and methods, and illustrative examples shown and described. Accordingly, departures may be made from such details without departure from the spirit or scope of the Applicant's general inventive concept.

The invention claimed is:

1. An ICPT system including a transmitting coil and a receiving coil wherein at least one coil is at least partly shielded by a magnetic shield formed of a plurality of elongate insulated conductors wherein the shield has a surface which in use is exposed to an incident magnetic field and wherein the elongate insulated conductors are arranged to distribute eddy currents from said exposure along a path length that is long with respect to the size of the shield.

2. The ICPT system as claimed in claim 1 wherein the elongate insulated conductors have an average thickness of about 1 to 3 skin depths in a plane transverse to the surface cross section.

3. The ICPT system as claimed in claim 1 wherein the elongate insulated conductors are arranged in a generally circular path.

4. The ICPT system as claimed in claim 1 wherein the elongate insulated conductors are arranged in a generally spiral path.

5. The ICPT system as claimed in claim 1 wherein the elongate insulated conductors are arranged in a semicircle.

6. The ICPT system as claimed in claim 1 wherein the elongate insulated conductors are arranged in a curved sheet.

7. The ICPT system as claimed in claim 1 wherein the elongate insulated conductors are capacitively loaded.

8. The ICPT system as claimed in claim 1 wherein the elongate insulated conductors are inductively loaded.

9. The ICPT system as claimed in claim 7 wherein the magnetic shield is tuned to screen a magnetic field oscillating at a desired frequency.

10. The ICPT system as claimed in claim 9 in the form of a disc.

11. The ICPT system as claimed in claim 1, wherein the at least one coil is at least partly shielded from its surrounds.

12. The ICPT system as claimed in claim 11, wherein the at least one coil is at least partly shielded from surrounding metallic elements.

13. The ICPT systems as claimed in claim 12, wherein the at least one coil is at least partly shielded from an adjacent coil.

14. A wind turbine including an ICPT system as claimed in claim 1.

* * * * *